United States Patent
Hom et al.

(10) Patent No.: US 10,522,881 B1
(45) Date of Patent: Dec. 31, 2019

(54) ESTIMATION OF SELF DISCHARGE RATE AS A MEASURE OF BATTERY HEALTH

(71) Applicant: Cora Aero LLC, Mountain View, CA (US)

(72) Inventors: Lewis Romeo Hom, Mountain View, CA (US); Dhruv Rathi, Palo Alto, CA (US)

(73) Assignee: CORA AERO LLC, Mountain View, CA (US)

( * ) Notice: Subject to any disclaimer, the term of this patent is extended or adjusted under 35 U.S.C. 154(b) by 0 days.

(21) Appl. No.: 15/870,496

(22) Filed: Jan. 12, 2018

(51) Int. Cl.
| | |
|---|---|
| *G01R 31/36* | (2019.01) |
| *H01M 10/48* | (2006.01) |
| *H01M 10/42* | (2006.01) |
| *G01R 31/3828* | (2019.01) |
| *G01R 31/3842* | (2019.01) |

(52) U.S. Cl.
CPC ........ *H01M 10/48* (2013.01); *G01R 31/3648* (2013.01); *G01R 31/3828* (2019.01); *G01R 31/3842* (2019.01); *H01M 10/425* (2013.01)

(58) Field of Classification Search
CPC . H01M 10/48; G01R 31/361; G01R 31/3624; G01R 31/3648
USPC .......................................................... 702/63
See application file for complete search history.

(56) References Cited

U.S. PATENT DOCUMENTS

| | | | | |
|---|---|---|---|---|
| 2007/0080664 A1* | 4/2007 | Maguire | ............... | H02J 7/0014 320/116 |
| 2009/0072793 A1* | 3/2009 | Chang | ................. | B60L 11/1809 320/134 |
| 2011/0089897 A1* | 4/2011 | Zhang | ................... | H02J 7/0016 320/116 |
| 2011/0163720 A1* | 7/2011 | Gonzales | ................ | B60L 58/22 320/116 |
| 2013/0049457 A1* | 2/2013 | Komatsu | ............... | H02J 7/0014 307/9.1 |
| 2013/0265008 A1* | 10/2013 | Suzuki | ................... | H02J 7/0021 320/126 |
| 2014/0303914 A1* | 10/2014 | Sejima | ............... | G01R 31/3624 702/63 |

(Continued)

FOREIGN PATENT DOCUMENTS

FR 2962265 * 1/2012

*Primary Examiner* — Michael P Nghiem
(74) *Attorney, Agent, or Firm* — Kilpatrick Townsend & Stockton LLP

(57) ABSTRACT

Various embodiments of a technique to estimate and monitor a self-discharge rate for use as a measure of battery health are described herein. In some embodiments, the technique includes a system including a processor and a memory coupled with the processor. The memory is configured to provide the processor with instructions that when executed cause the processor to receive a plurality of snapshots obtained by monitoring a battery system in a quiescent state at a plurality of times. Each snapshot includes a plurality of cell state values at one of the plurality of times. The memory is further configured to provide the processor with instructions that when executed cause the processor to estimate a self-discharge indicator using at least one snapshot in the plurality of snapshots, compare the self-discharge indicator to a threshold, and recommend a remedy for the battery system in response to the self-discharge indicator exceeding the threshold.

18 Claims, 16 Drawing Sheets

(56) References Cited

U.S. PATENT DOCUMENTS

2017/0018821 A1\* 1/2017 Springer .............. G01R 31/362
2019/0004115 A1\* 1/2019 Nakamura ............. G01R 31/36

\* cited by examiner

US 10,522,881 B1

ESTIMATION OF SELF DISCHARGE RATE AS A MEASURE OF BATTERY HEALTH

BACKGROUND OF THE INVENTION

Batteries stored for long periods of time can lose capacity from internal self-discharging as a result of irreversible side reactions that consume charge carriers without producing current. Because no cell is a perfect insulator, cells in a battery can noticeably self-discharge to some degree while the battery is idle or in a quiescent state. A quiescent state can occur for example when the battery is not in use and not being charged or balanced. A certain amount of self-discharge in a cell can be compensated for during cell balancing and charging by discharging the other cells to bring them to the same level of state of charge as the self-discharged cell. However, a particular cell's self-discharge rate may exceed what can be compensated for during the balancing and charging process. In this case, it may be necessary to replace the self-discharging cell or to recommend a remedy to address the issue before it causes battery failure. Accordingly, a technique for estimating and monitoring a self-discharge rate would be advantageous for use as a measure of battery health.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Various embodiments of a technique to estimate and monitor a self-discharge rate for use as a measure of battery health are described herein. In some embodiments, the technique includes a system including a processor and a memory coupled with the processor. The memory is configured to provide the processor with instructions that when executed cause the processor to receive a plurality of snapshots obtained by monitoring a battery system in a quiescent state at a plurality of times. Each snapshot includes a plurality of cell state values at one of the plurality of times. The memory is further configured to provide the processor with instructions that when executed cause the processor to estimate a self-discharge indicator using at least one snapshot in the plurality of snapshots, compare the self-discharge indicator to a threshold, and recommend a remedy for the battery system in response to the self-discharge indicator exceeding the threshold.

Figure 1:
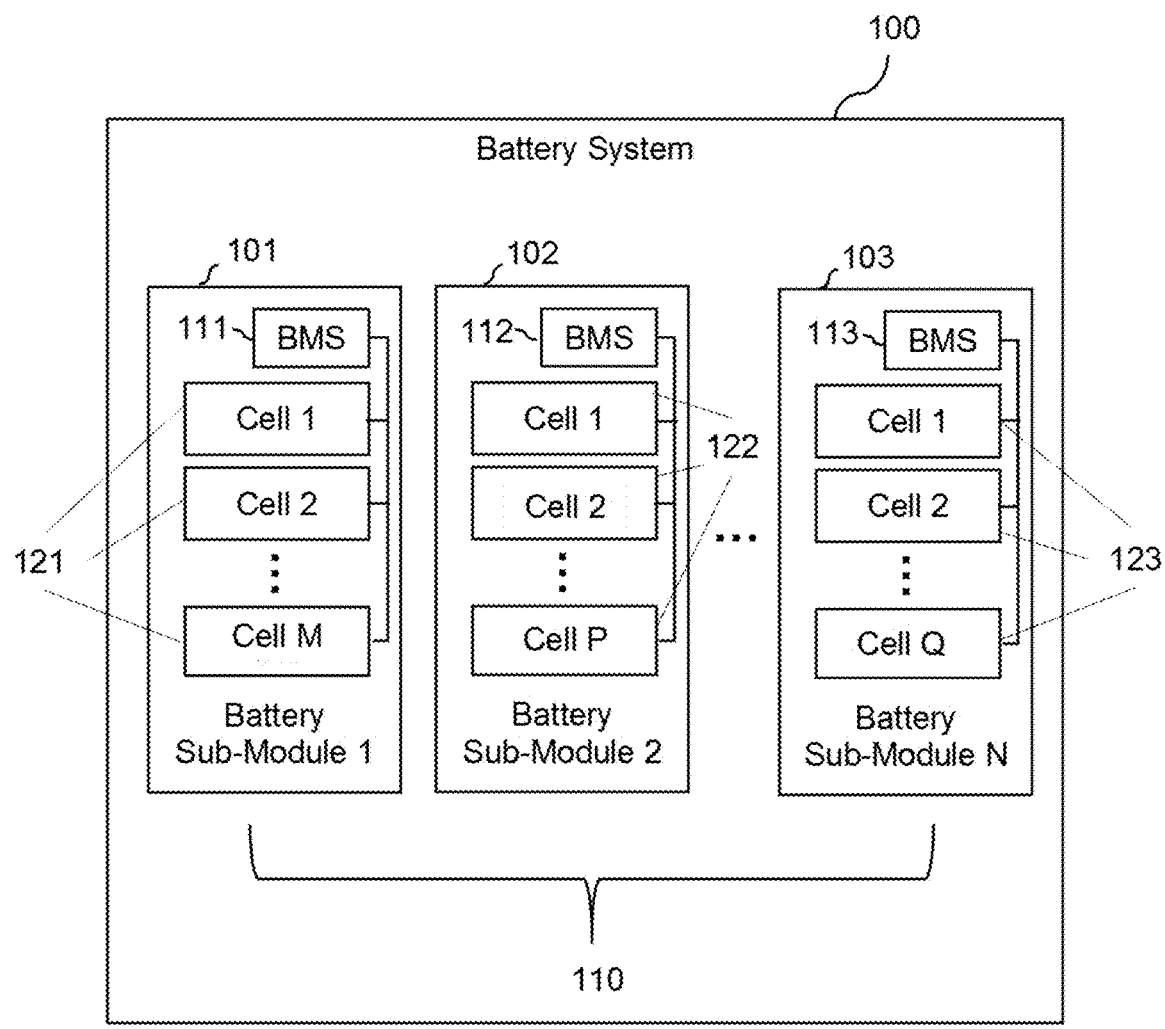
FIG. 1 shows an exemplary embodiment of a battery system that estimates and monitors a self-discharge rate for use as a measure of battery health.

FIG. 1 shows an exemplary embodiment of a battery system that estimates and monitors a self-discharge rate for use as a measure of battery health. A battery system can have multiple independent battery systems or sub-modules that consist of one or more electrolytic cells. The cells can have varying capacities and levels of state of charge (SOC). Differences between individual cells can be attributed to differences in manufacturing, assembly, and what a particular cell has undergone in its history (e.g., age and/or wear), including for example cell charging and discharging and exposure to heat or other elements.

In this example, Battery System 100 includes a plurality of battery sub-modules 110 each having a plurality of cells. In this example, Battery Sub-Module 1 at 101 has a plurality of cells 121, Battery Sub-Module 2 at 102 has a plurality of cells 122, and Battery Sub-Module N at 103 has a plurality of cells 123, where N denotes the total number of battery sub-modules in Battery System 100. In some embodiments, the Battery Sub-Modules have rigid exteriors or packaging and Battery Sub-Modules can be swapped out as/if needed. In this example, the battery management systems (BMS) are used to manage each rechargeable sub-module. Here, BMS 111 manages Battery Sub-Module 1 at 101, BMS 112 manages Battery Sub-Module 2 at 102, and BMS 113 manages Battery Sub-Module N at 103. Each BMS in this example monitors the state of the cells in its respective sub-module, collects and reports data related to the cells in its associated sub-module, and calculates secondary data associated with the cells in its associated sub-module. Each BMS (in this example at least) also provides active cell balancing, temperature monitoring, charging, and other features useful for improving its sub-module's longevity. Battery System 100 may be used to power an aircraft or other vehicle configured to run on a rechargeable battery system.

Figure 2:
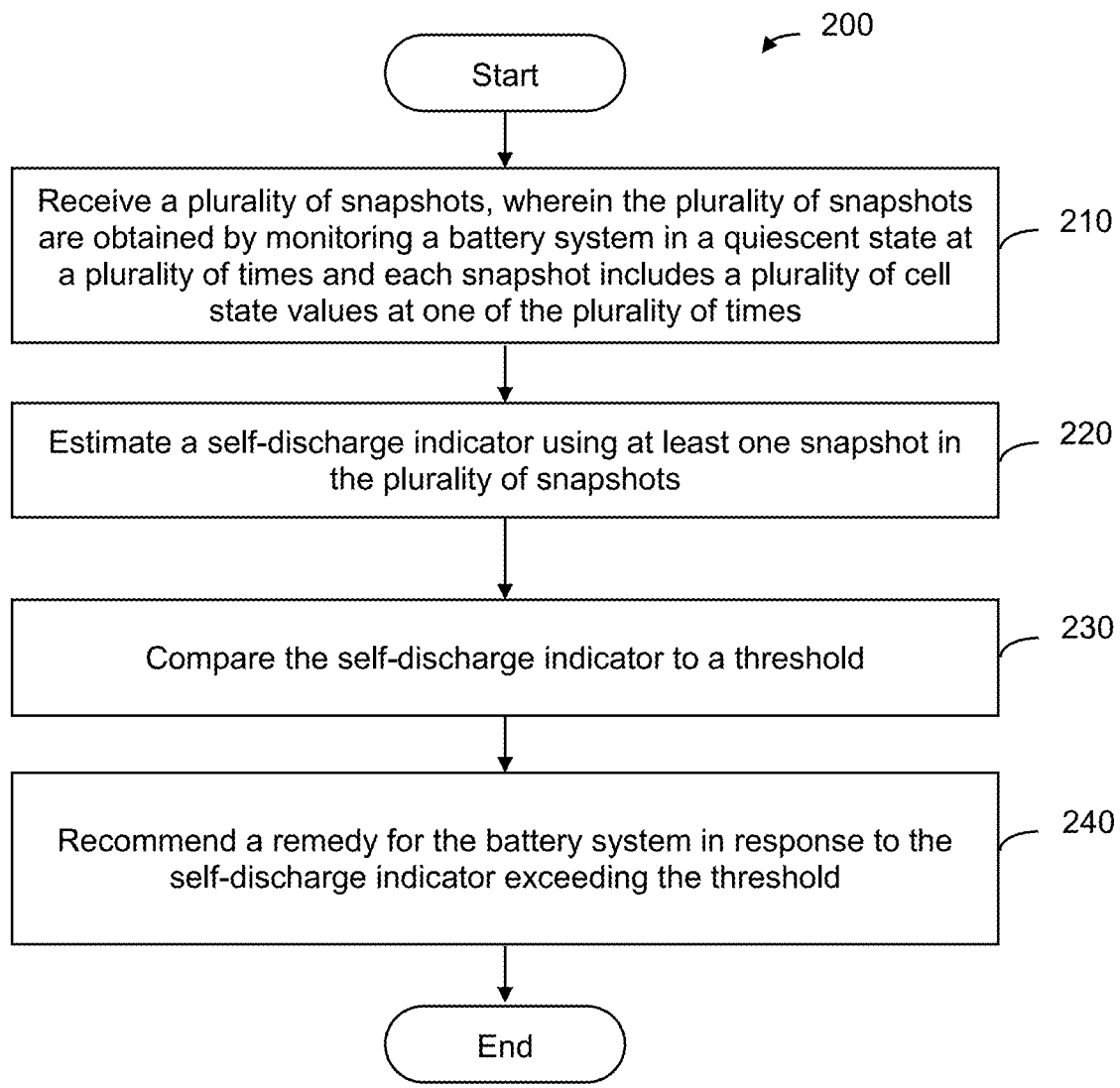
FIG. 2 is a flowchart depicting an exemplary process to estimate a self-discharge rate using a plurality of snapshots obtained by monitoring a battery system in a quiescent state at a plurality of times.

FIG. 2 is a flowchart depicting an exemplary process 200 to estimate a self-discharge rate using a plurality of snapshots obtained by monitoring a battery system in a quiescent state at a plurality of times. Step 210 of the process is to receive a plurality of snapshots, wherein the plurality of snapshots are obtained by monitoring a battery system in a quiescent state at a plurality of times and each snapshot includes a plurality of cell state values at one of the plurality of times. The cell state values can be cell voltages, levels of state of charge, or current. A snapshot captures the cell state values at a particular instant of time. The snapshots can be taken periodically at regular time intervals to track the cell state values as they change over time. Step 220 is to estimate a self-discharge indicator using at least one snapshot in the plurality of snapshots. Step 230 is to compare the self-discharge indicator to a threshold. Step 240 is to recommend a remedy for the battery system in response to the self-discharge indicator exceeding the threshold.

As will be described in further detail below, a self-discharge indicator can be associated with a cell. In particular, a self-discharge indicator can be estimated and monitored for each cell in the plurality of cells in each of the battery sub-modules 101, 102, and 103.

The self-discharge indicator can be a voltage, a state of charge, a capacity, or a self-discharge rate. In some embodiments, a self-discharge rate is in units of amperes per second and/or relates to leakage (e.g., another way of describing self-discharge).

Figure 3:
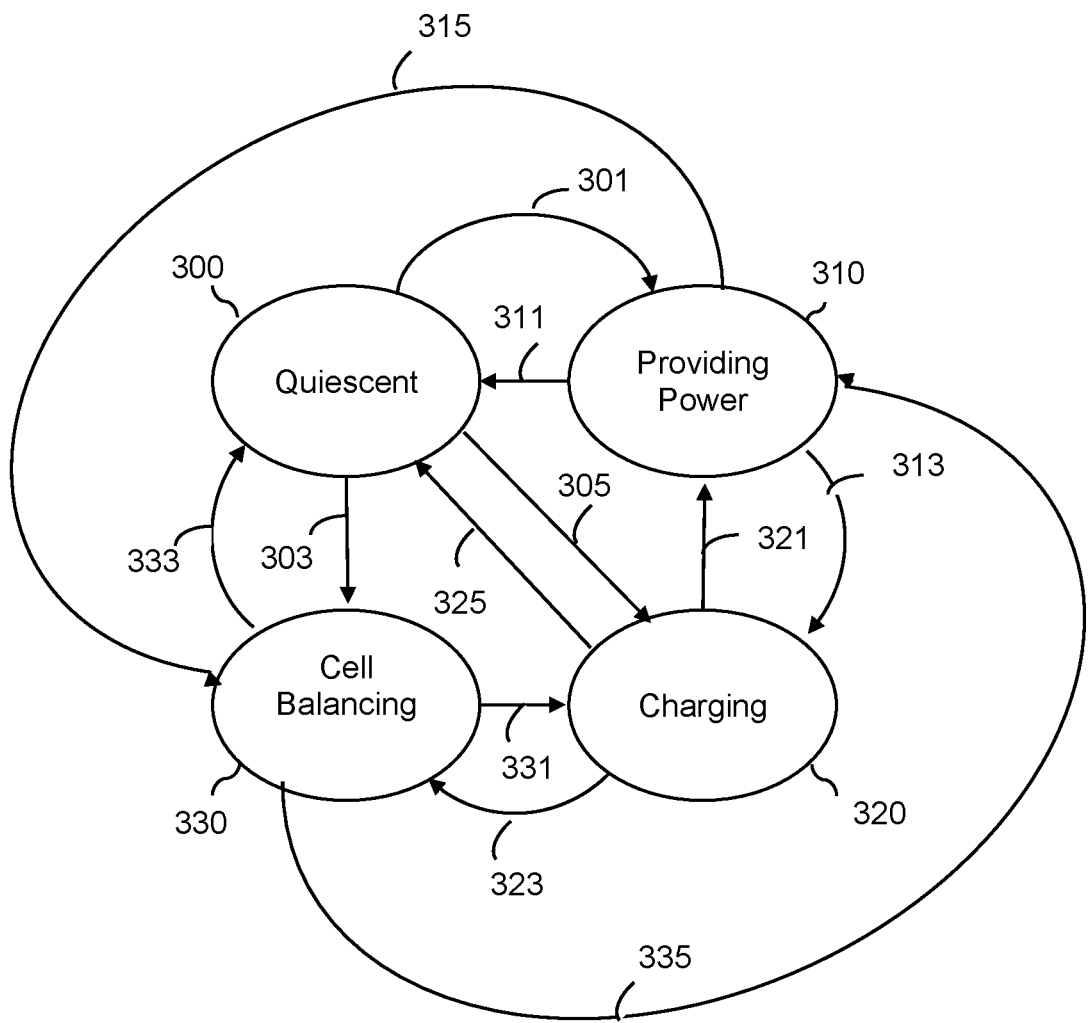
FIG. 3 depicts various states that can apply to an exemplary embodiment of a battery system as described herein.

FIG. 3 depicts various states that can apply to an exemplary embodiment of a battery system as described herein. As shown in FIG. 3, a battery system can be in a quiescent state 300 when it is idle, at rest, or not in use and can transition at 301 to a state where it is in use and providing power 310. The battery system can also transition at 305 from the quiescent state 300 to a state where it is undergoing charging 320. Alternatively, the battery system can transition at 303 from the quiescent state 300 to a state where it is undergoing balancing and charging 330. Balancing and charging 330 differs from charging 320 in that at least one battery sub-module is selected to be discharged (e.g., typically the battery sub-module with the highest amount of charge (sometimes referred to as the state of charge)) while the other battery sub-modules are charged in order to bring the amounts of charge (i.e., states of charge) across all battery sub-modules closer to each other. Battery or cell balancing can maximize the capacity of a battery system or sub-module having multiple cells (typically in series) to optimize the capacity available for use and increase each cell's longevity. In particular, the energy that can be taken from and returned to the battery is limited because discharging during use must stop when the cell with the lowest capacity is empty even if the other cells are not. Accordingly, to account for cell differences and to maximize the longevity of a battery system or battery sub-module, cell balancing is performed during the battery charging process to ideally bring all of the cells to the same level of state of charge.

Possible transitions to and from the various other states are shown in FIG. 3. The battery system can transition at 311 from providing power 310 to being in a quiescent state 300, as for example when a battery-powered vehicle is turned off after being in use. The battery system can also transition at 313 from providing power 310 to charging 320, for example when a battery-powered vehicle is connected to a charging system after being in use. Alternatively, the battery system can transition at 315 from providing power 310 to a state where balancing and charging are performed at 330.

The battery system can transition at 321 from charging 320 to providing power 310, as for example is the case where a battery is being charged before it is used, and can transition at 325 to the quiescent state 300 if the charging is discontinued but the battery system is idle and is not being used. At 323 the battery system can transition from charging 320 to a balancing and charging state 330 as would be the case if one were to initiate a balancing process after charging the battery system.

A transition can also be made at 331 from cell balancing and charging 330 to charging 331, or a transition at 333 can be made to the quiescent state 300. The battery system can also transition at 335 from the cell balancing and charging state 330 to providing power 310. This would be the case, for example, if the battery system is put to use after it undergoes cell balancing and charging.

The cells in each battery sub-module self-discharge at different rates (e.g., depending upon manufacturing differences, age, wear, etc.). Thus, a problem can arise when a cell self-discharges at a rate that is higher than the ability to replace its voltage or charge by the cell balancing and charging process. More specifically, if a cell is self-discharging at a high enough rate it may never be balanced because the self-discharging cell will be consistently at a lower voltage than the rest of the cells. Because the self-discharging cell's abnormally low voltage cannot be mitigated by cell balancing and charging, the self-discharging cell can be highly problematic and can cause the battery system to fail if the problematic cell or sub-module containing the problematic cell is not replaced. Accordingly, the earlier a problematic self-discharging cell is identified, the more likely the risk of battery system failure can be mitigated by performing certain preventative or remedial operations.

The self-discharge rate impacts how long a battery can be stored or remain in a quiescent state. While self-discharging is not really an issue while the battery is in use, it can be a concern for battery-powered recreational vehicles that are stored or remain idle for extended or prolonged periods of time in between use (e.g., days or weeks). But monitoring the self-discharge rate can pose a challenge because the background self-discharge rate of cells in a battery system is relatively low with respect to what can be detected by a typical current sensor that might be used in a battery-powered application. For example, the current sensed in a battery-powered aircraft application can range anywhere from −50 amps to 400 amps, while self-discharge rates can be on the order of 100 microamps with most cells being in the tens of microamps—a value falling well below the precision of the typical current sensor. Because the self-discharge rate lies inside the resolution of the current sensor, another approach is required to accurately estimate and monitor the self-discharge rate of a problematic cell.

For this reason, at step 200 in FIG. 2, cells in a battery system are monitored while the battery system is in a quiescent state. Monitoring while in a quiescent state provides a better estimate of internal self-discharging of a cell by effectively isolating the cell from the impact of external factors that can actively increase or decrease the cell's voltage or charge (e.g. using the battery, charging, or cell balancing and charging as shown in FIG. 3) but have nothing to do with the cell's internal self-discharge rate.

Returning briefly to FIG. 2, it may be helpful to show some examples of snapshots which are received at step 210. The following figure shows some snapshot examples.

Figure 4:
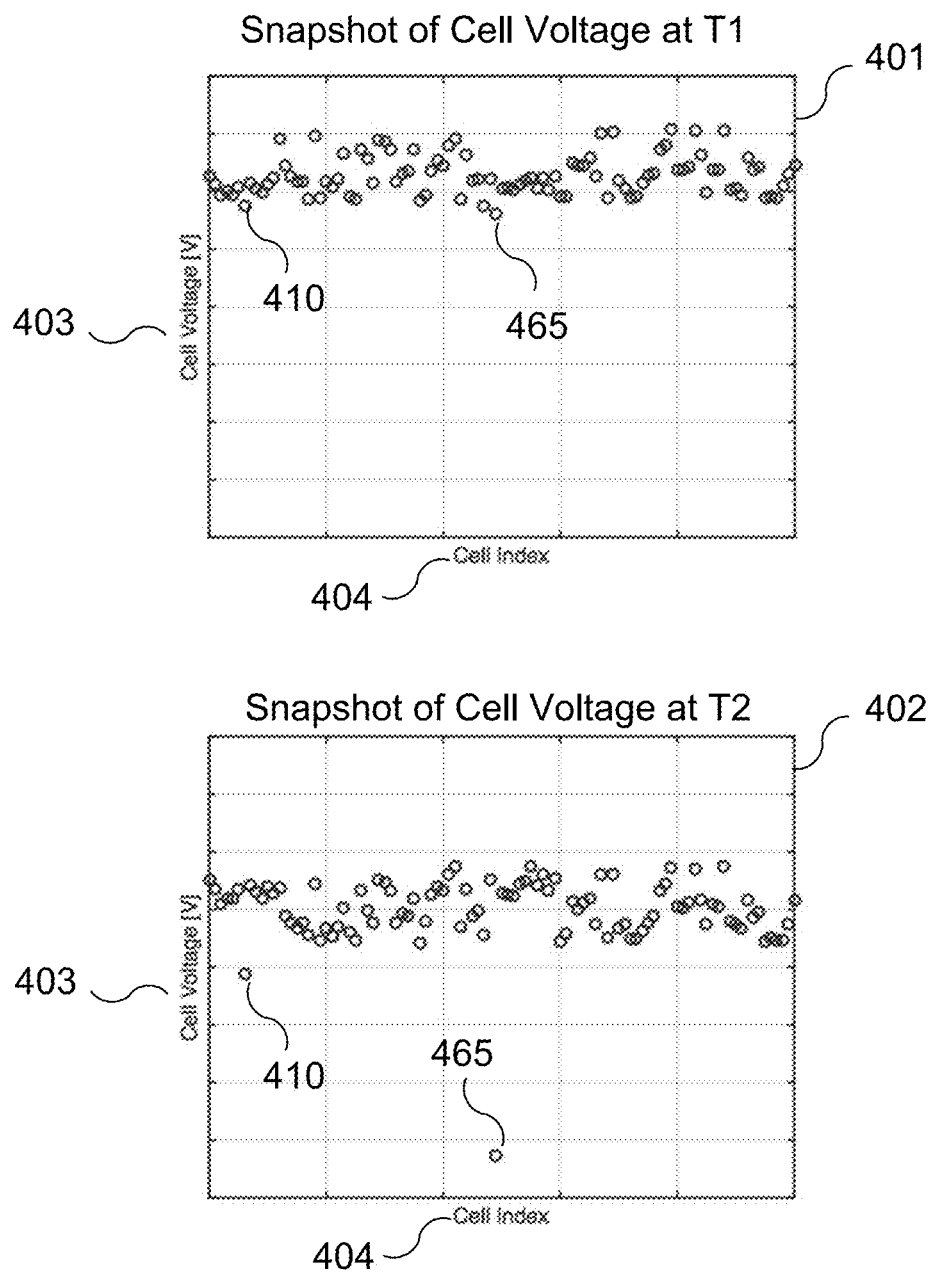
FIG. 4 depicts an example of two snapshots obtained by monitoring a battery system in a quiescent state taken at two different points in time.

FIG. 4 depicts an example of two snapshots obtained by monitoring a battery system in a quiescent state taken at two different points in time. Each snapshot is generated from data collected by a BMS or other system configured to monitor or collect data related to cells in the battery system. Each snapshot captures cell state values of the cells in a battery system at a particular instant in time. Each cell is represented by a cell index and the cell state values can be cell voltages, levels of state of charge (SOC), or current. While no units are indicated, the snapshots are taken using the same scale on the x-axis and y-axis to facilitate a direct comparison. This allows one to compare the second snapshot taken at a later time directly to the first snapshot, and thus to track the evolution of the cell state value for a given cell as represented by the cell index. The battery system in this example is used to power an aircraft.

In the example shown, the snapshots are two-dimensional graphs plotting the voltage for each individual cell (represented by a cell index) in the battery system at two different times T1 and T2, with Cell Index 404 on the x-axis and Cell Voltage (V) 403 corresponding to each cell index on the y-axis. A first snapshot 401 captures cell voltages corresponding to cells in the battery system taken at a first time, T1, after the system has transitioned at 333 to a quiescent state 300 from a cell balancing and charging state 330 as shown in FIG. 3. Balancing and charging the cells serves to reset the cell state values, effectively positioning the cells to start in the same place before they are monitored in a quiescent state in which the cells will begin to self-discharge at different rates. In this example, snapshot 401 captures cell voltages at a time T1 at an early stage after the battery has entered a quiescent state, for example, on the first day the battery system is at rest in the quiescent state after having undergone balancing and charging.

A second snapshot 402 captures cell voltages corresponding to cells in the battery system taken at a second later point in time T2, after time T1, of the first snapshot 401. In this case, snapshot 402 represents cell voltages captured for example on Day 2 of monitoring the battery system while in the quiescent state. In this example, between time T1 and T2, the battery system did not leave the quiescent state.

Comparing the cell voltages in the two snapshots, the first snapshot 401 shows the cell voltages to be clustered at around the same value with no outliers indicating no problematic self-discharging cells. The second snapshot 401 shows that, after the passage of time between T1 and T2, the cell voltages all appear to have dropped in value, with two cells—shown as the cell at 410 and the cell at 465—having decreased more in voltage than the others.

While the drop in voltage in the two cells as shown in the second snapshot 402 may indicate that the two cells are self-discharging, voltages alone are not telling of a cell's capacity. In particular, because the true state of a cell is hidden and not directly observable, other metrics such as state of charge and capacity are used to provide a better indication of cell state. State of charge and capacity are considered in addition to voltage because monitoring voltage alone fails to account for other factors that impact a cell's state such as a cell's individual maximum charge capacity.

In some embodiments, to account for differences in capacity, cell voltages are converted to state of charge (SOC) for each cell when estimating a self-discharge rate. Alternatively, if it is known that the charge capacities of all cells in a specific sub-module are roughly equal, then additional calculations to convert voltage into SOC (as an example) may be skipped for speed and/or conservation of processing resources. The SOC represents the available capacity in the cell expressed as a percentage of a reference point (e.g. current capacity). In this manner, the SOC provides a metric for the amount of energy left in a cell compared with the energy it had when it was at full capacity thus providing a better indication than voltage of how much longer the cell can be used before it requires recharging. The SOC estimate can be considered analogous to the gas gauge or fuel gauge for a fuel tank in a car. Conversion from cell voltages to SOC can improve the ability to distinguish whether observed lower voltage levels are indicative of a problematic self-discharge rate as opposed to a cell's lower capacity. The following figure shows an example of how voltage and SOC are related.

Figure 5:
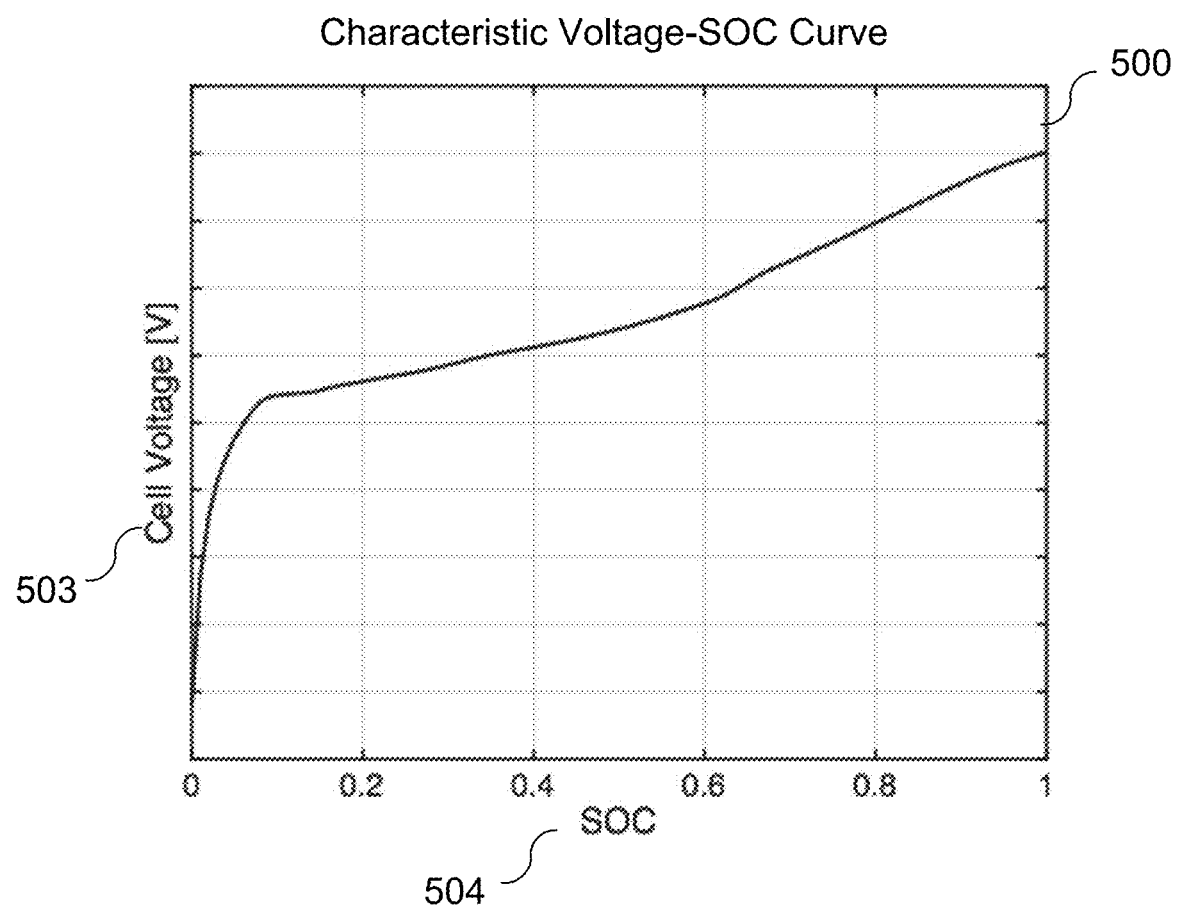
FIG. 5 is a plot of a characteristic voltage-SOC curve that shows how SOC and cell voltage are related.

FIG. 5 is a plot of a characteristic voltage-SOC curve that shows how SOC and cell voltage are related. The characteristic voltage-SOC curve 500, which is a function of cell chemistry, can be used to convert cell voltages into SOC values for each cell in the battery system. In this example, SOC is shown on the x-axis at 504 and Cell Voltage is shown on the y-axis at 503. This curve is used to generate the plots in the following figure.

Figure 6:
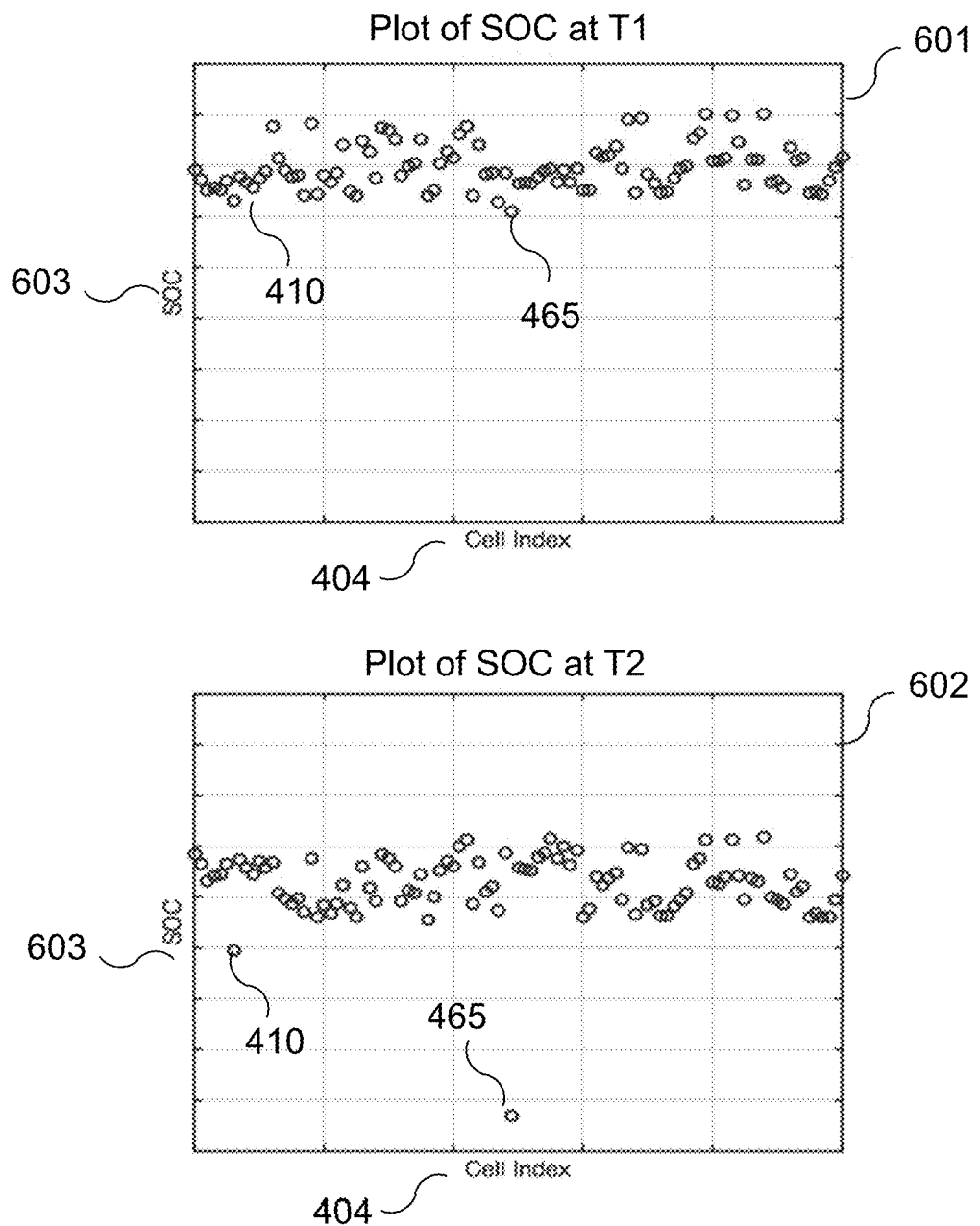
FIG. 6 depicts an example of two plots obtained by converting cell voltages into SOC values.

FIG. 6 depicts an example of two plots obtained by converting cell voltages into SOC values using a characteristic voltage-SOC curve as shown in FIG. 5 and cell voltages obtained from the two snapshots of FIG. 4 taken at two different points in time, T1 and T2. The plots are two-dimensional graphs depicting the SOC for each individual cell (represented by a cell index) in the battery system at two different times T1 and T2, with Cell Index 404 on the x-axis and SOC 603 corresponding to each cell index on the y-axis. A comparison of the two plots in FIG. 6 appears to indicate a similar outcome identifying the same two outlier cells, 410 and 465, as shown in FIG. 4. Here, the first plot 601 shows SOC values for the cells clustered at around the same value with no outliers indicating no problematic self-discharging cells, while the second plot 602 shows that, after the passage of time between T1 and T2, the SOC values all appear to have dropped in value, with two cells—the cell at 410 and the cell at 465—having decreased more in SOC than the others. Thus far, tracking the cell voltages and the SOC values for each cell provide a consistent indication that the two cells 410 and 465 may be self-discharging. However, converting the SOC values to capacity may provide a better estimate of whether a cell is self-discharging. This is shown in the following example.

Figure 7:
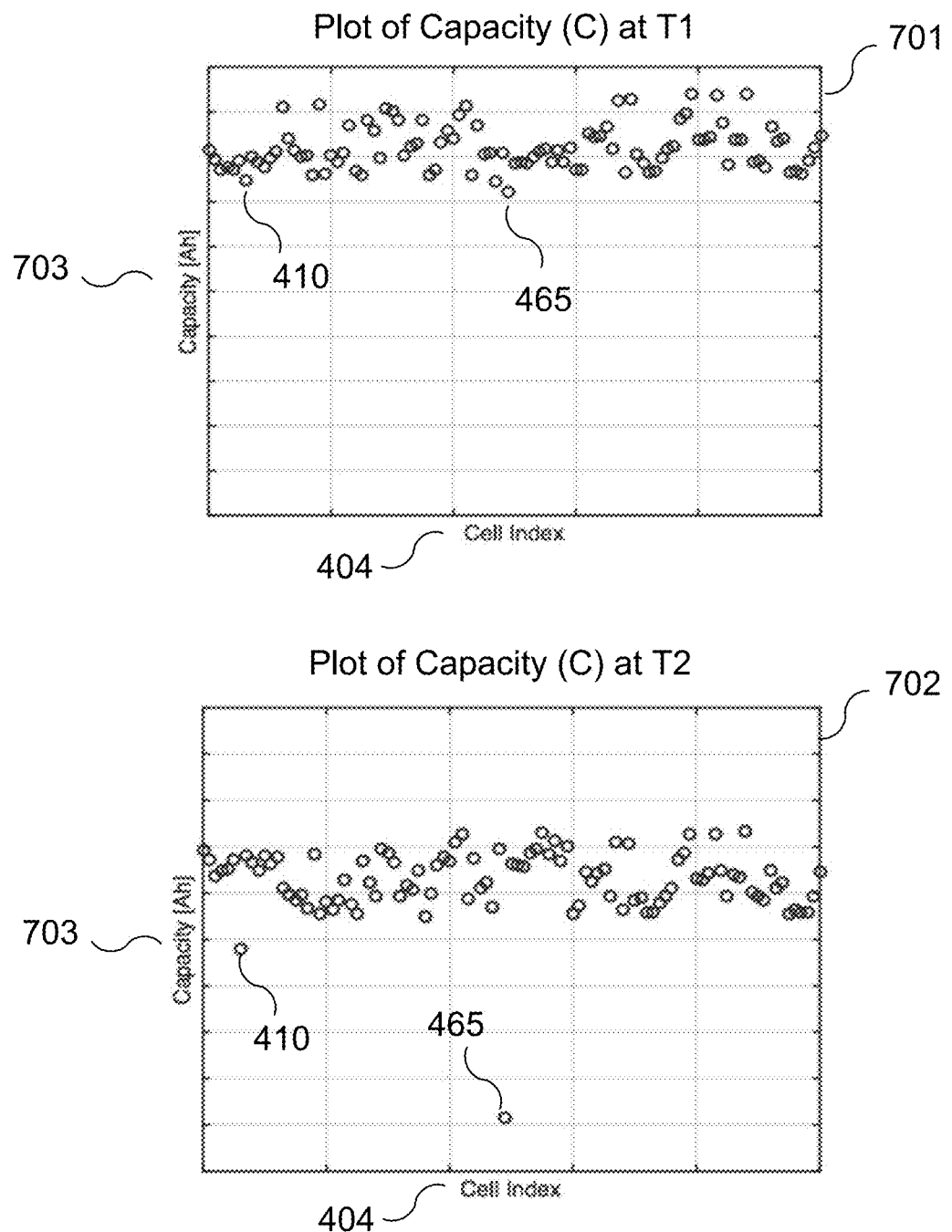
FIG. 7 depicts an example of two plots obtained by converting SOC values to capacity.

FIG. 7 depicts an example of two plots obtained by converting SOC values to capacity, the cell voltages being obtained from the two snapshots of FIG. 4 taken at two different points in time and converted to SOC values via a characteristic voltage-SOC curve as shown in FIG. 5 and as plotted in FIG. 6. The plots are two-dimensional graphs depicting the capacity for each individual cell (represented by a cell index) in the battery system at two different times T1 and T2, with Cell Index 404 on the x-axis and Capacity 703 corresponding to each cell index on the y-axis. In the example shown, the Capacity (C) of each cell is determined by multiplying each cell's SOC by its maximum charge capacity (CO). Note that the CO of each cell may be different and must be determined by an independent state of health (SOH) update process. This is an important distinction because cells with different SOCs may actually have the same capacity value if they have different CO values.

Here, as in the previous comparisons of cell voltage snapshots of FIG. 4 and SOC plots of FIG. 6, a comparison of the two plots in FIG. 7 reveals a similar outcome. Specifically, the first plot 701 shows the cell capacities clustered at around the same value with no outliers indicating no problematic self-discharging cells, while the second plot 701 shows that, after the passage of time between T1 and T2, the cell capacities all appear to have dropped in value, with two cells—the cell at 410 and the cell at 465—having decreased more in capacity than the others.

Having determined cell capacities at two different times as shown in FIG. 7, a self-discharge rate ($I_{SD}$) for each cell may now be estimated as the change in capacity over time. More specifically, given two cell capacity values taken at two different times, for example as shown in FIG. 7, it is possible to determine the change in capacity over that time. A threshold can be set on the estimated self-discharge rate to determine which cells are self-discharging at an unacceptable rate (e.g., at a rate that cannot be compensated for by cell balancing and charging) where a remedy is needed. However, varying electronics loads may get convolved into the estimate of capacity or self-discharge current, making fine-tuning any fault threshold difficult.

Capacity (C) can be expressed in units of coulombs and the self-discharge rate in units of amperes (i.e. coulombs per second). In the examples shown, capacity is expressed in units of ampere hours (Ah), which is a unit of electric charge. Capacity may be used to instantaneously determine the health of the cell while self-discharge rate may be to forecast future cell health (e.g., depending upon how long the battery system will be idle and whether to replace a sub-module). Most broadly, the self-discharge rate informs maintenance decisions. As described in more detail with respect to FIG. 8 below, in some embodiments a self-discharge rate is determined by first determining two capacity values (e.g., associated with known times T1 and T2) and then finding the self-discharge rate from the two capacity values and the times T1 and T2.

Figure 8:
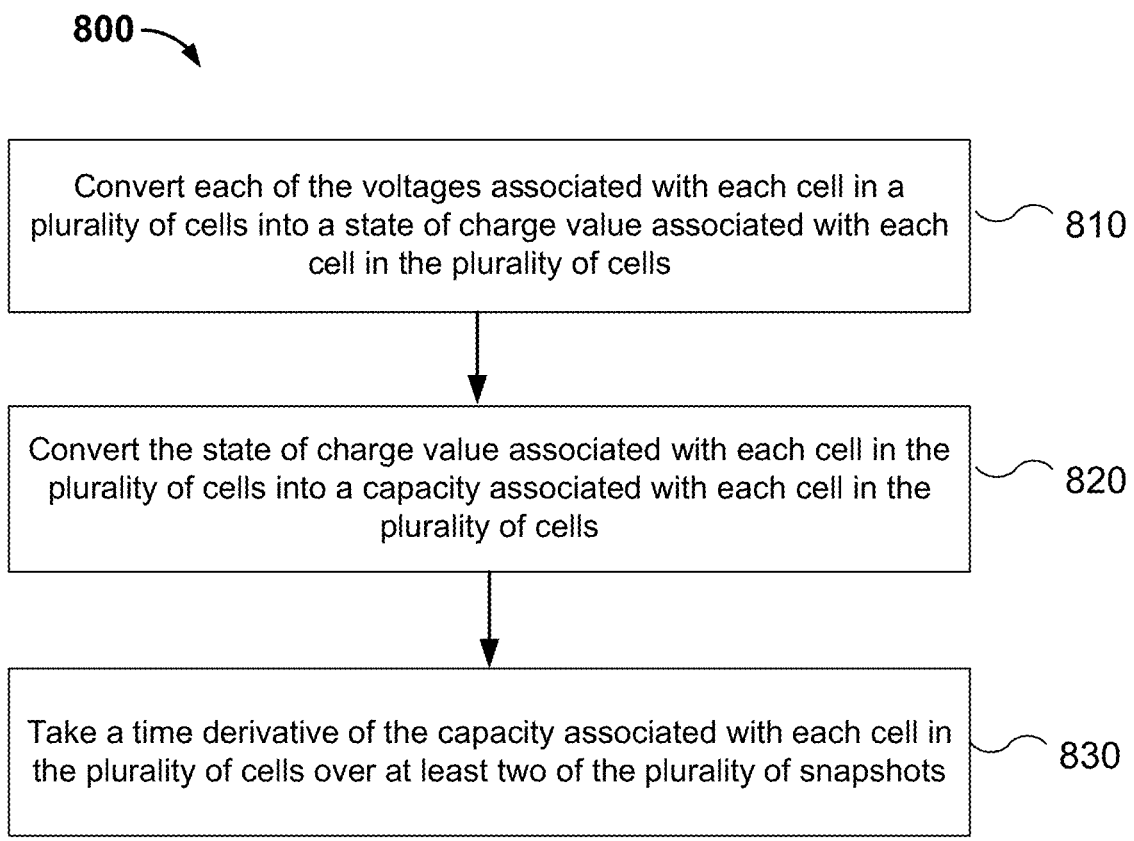
FIG. 8 is a flowchart of an exemplary method to estimate self-discharge rate.

FIG. 8 is a flowchart of an exemplary method to estimate self-discharge rate ($I_{SD}$) as described thus far. The method 800 includes converting each of the voltages associated with each cell in a plurality of cells into a state of charge value associated with each cell in the plurality of cells at 810 and converting the state of charge value associated with each cell in the plurality of cells into a capacity associated with each cell in the plurality of cells at 820. In the method, estimating the self-discharge rate includes taking a time derivative of the capacity associated with each cell in the plurality of cells over at least two of the plurality of snapshots at 830. As described above, each of the two plurality of snapshots includes a plurality of cell state values at two different times.

Figure 9:
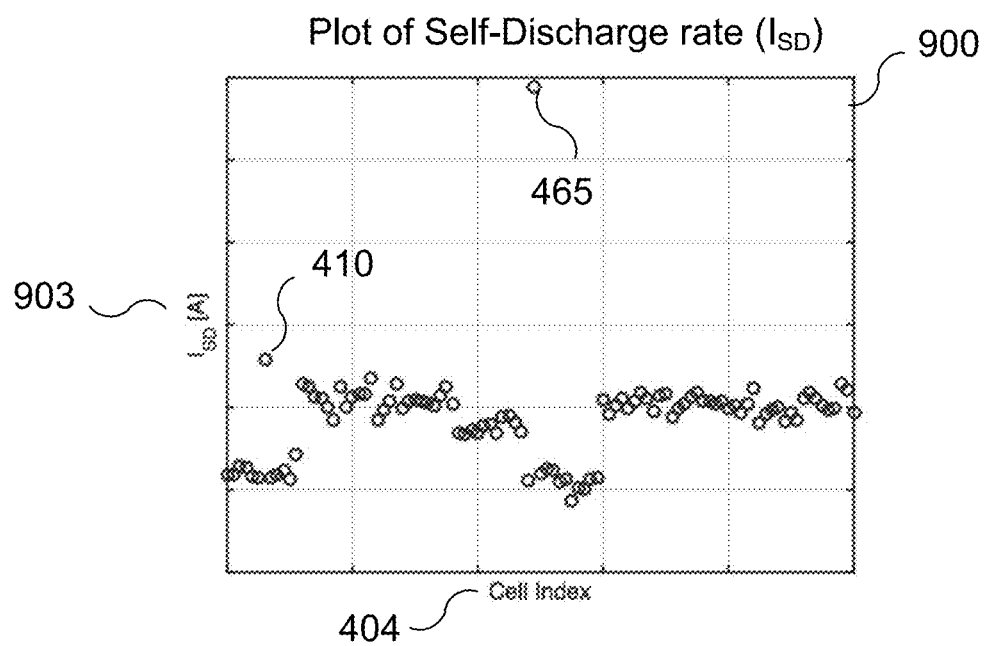
FIG. 9 shows a plot of the self-discharge rate for cells in a battery system.

FIG. 9 shows a plot of the self-discharge rate ($I_{SD}$) for cells in the battery system. The plot is a two-dimensional graph depicting the self-discharge rate ($I_{SD}$) at 900 for each individual cell (represented by a cell index) in the battery system with Cell Index 404 on the x-axis and self-discharge rate ($I_{SD}$) 903 corresponding to each cell index on the y-axis. In the example shown, a self-discharge rate ($I_{SD}$) is determined by taking a time derivative of two cell capacity values over time. In this case, two cell capacity values for each cell are obtained from the two plots in FIG. 7 and result in the self-discharge rate ($I_{SD}$) values plotted in FIG. 9.

Not surprisingly, FIG. 9 shows that two cells—the cell at 410 and the cell at 465—have higher self-discharge rates ($I_{SD}$)) than the others. However, while cell 465 clearly has a higher self-discharge rate than the rest of the cells and would therefore be detected by setting a threshold for self-discharge rate that would exclude the problematic self-discharging cells, cell 410 appears to be only slightly higher than the general cell population in the battery system. In this case, cell 410 is probably a problematic self-discharging cell (as indicated in the previous graphs of FIGS. 4, 6, and 7) but because its estimated self-discharge rate is relatively close to the rest of the cell population, it is not likely to be flagged based on setting a threshold chosen to minimize false positives (i.e. flagging a cell that is not problematic as a problematic self-discharging cell).

A possible reason that the estimated self-discharge rate of cell 410 is closer to the estimated self-discharge rates of the other cells is that it is a part of a block of cells, in this case, a sub-module in the battery system, experiencing low self-discharge overall. This can be due to the vagaries of electronics loads, which can selectively affect different sets of cells or sub-modules hooked up to the same BMS. The method shown in FIG. 8 does not remove the effect of variation between different sub-modules, where cells in the same module are likely to exhibit similar properties due to shared conditions (e.g. electronics loads that are shared by the cells in a sub-module but that differ from sub-module to sub-module). Accordingly, comparing cell 410 to the general cell population in the battery system will not set it apart—instead it must be compared to its neighbors—namely, the cells within its block or sub-module which share the same external influences that can impact the estimated self-discharge rate of each cell in the sub-module. Using the method of FIG. 8 for estimating self-discharge rates in which cells are compared to all of the other cells in the battery system without regard to sub-modules, the high self-discharge rate for cell 410 would likely go unnoticed as shown in the plot of FIG. 9.

As described above, a BMS or other system can be used to track or monitor the change of each cell's voltage level, but to better monitor self-discharge rates and in particular, to address the issue described above with respect to cell 410, cell differences due to the group or collection of cells in replaceable units or battery sub-modules must be considered and taken into account. Notably, one implication of this group or collection is that a cell cannot be replaced on its own due to the physical boundary constraint imposed by the sub-module (to put it another way, swap ins/outs occur at the sub-module level, not the cell level, because that is how they are packaged). Consequently, if a problematic self-discharging cell is detected, the entire sub-module containing the problematic cell must be replaced. This also means that because voltage levels can and often do vary widely between different sub-modules, a cell having a low voltage relative to the entire population of cells in the battery system may not have a self-discharging problem if it happens to belong to a sub-module in which all of the cells in the sub-module are at a lower voltage relative to the rest of the cell population.

Thus, rather than comparing cells from different sub-modules across the entire battery system, the technique described herein and depicted in the following figure facilitates more meaningful comparisons between cells within their respective sub-modules leading to improved detection of problematic self-discharging cells.

Figure 10:
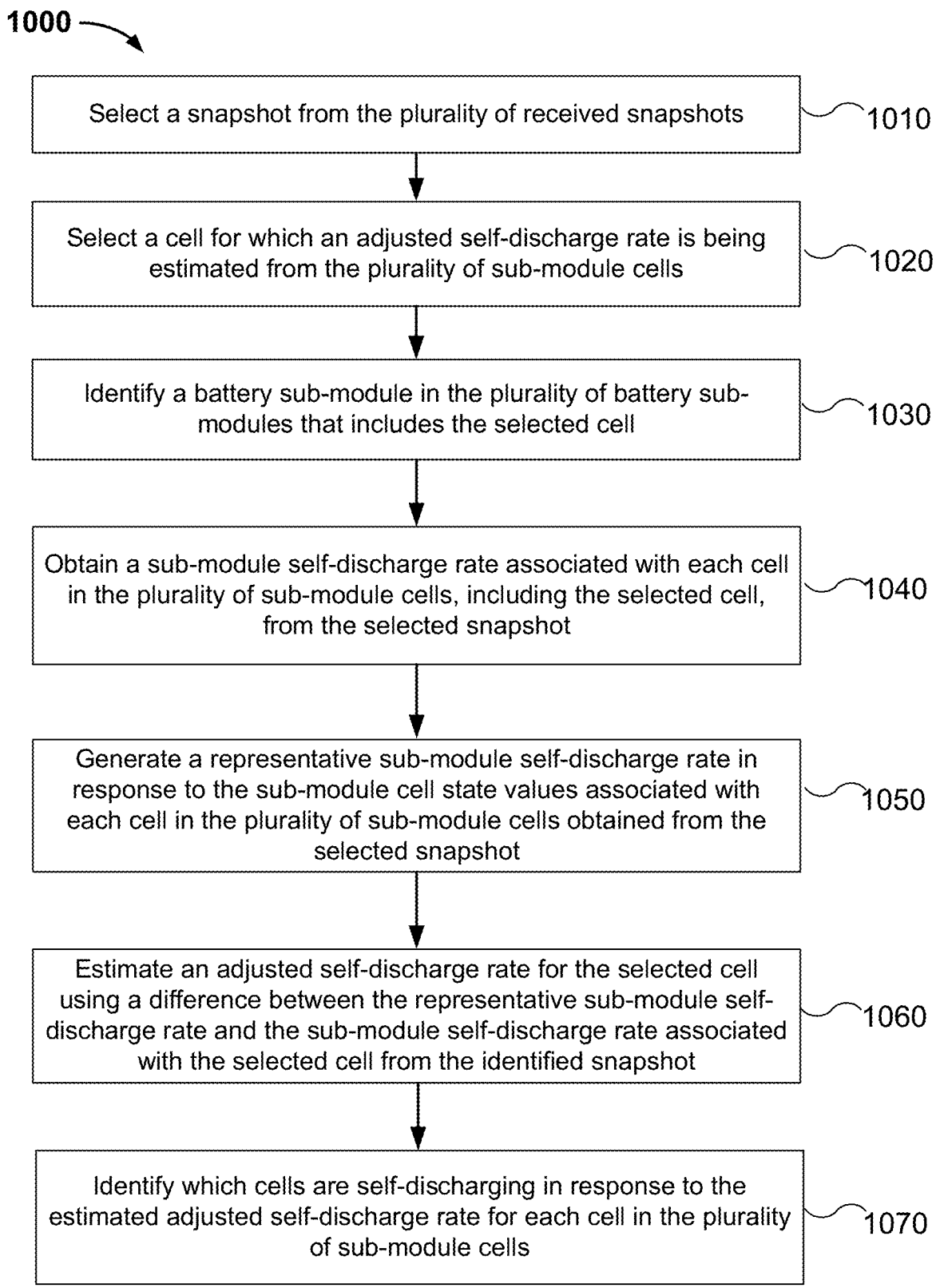
FIG. 10 is a flowchart showing an embodiment of a process to estimate an adjusted self-discharge rate.

FIG. 10 is a flowchart showing an embodiment of a process to estimate an adjusted self-discharge rate, including by taking into consideration of cell differences due to the particular group or collection of cells in a battery sub-module and thus accounting for variation between sub-modules. In some embodiments, the step 220 to estimate a self-discharge indicator using at least one snapshot in the plurality of snapshots includes various steps as depicted in FIG. 10 to estimate an adjusted self-discharge rate for the cell that adjusts for the block to block variation between groups of cells that share a sub-module.

Returning to FIG. 1, recall that the battery system shown includes a plurality of Battery Sub-Modules 101, 102, and 103, and that each of the plurality of the battery sub-modules includes a plurality of sub-module cells. For example, Battery Sub-Module 101 includes sub-module cells 1-M at 121, Battery Sub-Module 102 includes sub-module cells 1-P at 122, and Battery Sub-Module 103 includes sub-module cells 1-Q at 123. Additionally, each cell in the plurality of sub-module cells has a cell state value captured in each of the plurality of received snapshots. For example, although the grouping of cells into sub-modules is not shown in the snapshots and plots described herein, FIG. 4 shows two snapshots of cell state values that are cell voltages corresponding to cells in each of the plurality of sub-modules in the battery system.

Returning back to the example of FIG. 10, a method to estimate a self-discharge rate using a plurality of snapshots obtained by monitoring a battery system in a quiescent state at a plurality of times includes estimating an adjusted self-discharge rate for each cell in the plurality of sub-module cells.

The method begins by selecting a snapshot from the plurality of received snapshots at 1010 and selecting a cell for which an adjusted self-discharge rate is being estimated from the plurality of sub-module cells at 1020. The method also includes identifying a battery sub-module in the plurality of battery sub-modules that includes the selected cell at 1030. For example, in FIG. 1, if an adjusted self-discharge rate was being determined for any of cells 121, then battery sub-module 111 would be identified at step 1030.

A sub-module self-discharge rate associated with each cell in the plurality of sub-module cells, including the selected cell, is obtained from the selected snapshot at 1040. As an example, the sub-module self-discharge rate associated with each cell in the plurality of sub-module cells can be obtained via the exemplary method depicted in FIG. 8 and described above.

A representative sub-module self-discharge rate is generated at 1050 in response to the sub-module self-discharge rates associated with each cell in the plurality of sub-module cells obtained from the selected snapshot. As an example, the representative sub-module self-discharge rate can be a median or a mean value of the sub-module self-discharge rates associated with each cell in the plurality of sub-module cells obtained from the selected snapshot but other methods of determining a representative sub-module self-discharge rate may also be used.

An adjusted self-discharge rate for the selected cell is estimated at 1060 using a difference between the representative sub-module self-discharge rate and the sub-module self-discharge rate associated with the selected cell from the identified snapshot.

Finally, the method includes identifying which cells are self-discharging in response to the estimated adjusted self-discharge rate for each cell in the plurality of sub-module cells at 1070. As described previously with respect to estimating self-discharge rates for each cell as shown in FIG. 9, a threshold can be used to determine whether an adjusted self-discharge rate for a particular cell is unacceptably high and requires a remedy.

Figure 11:
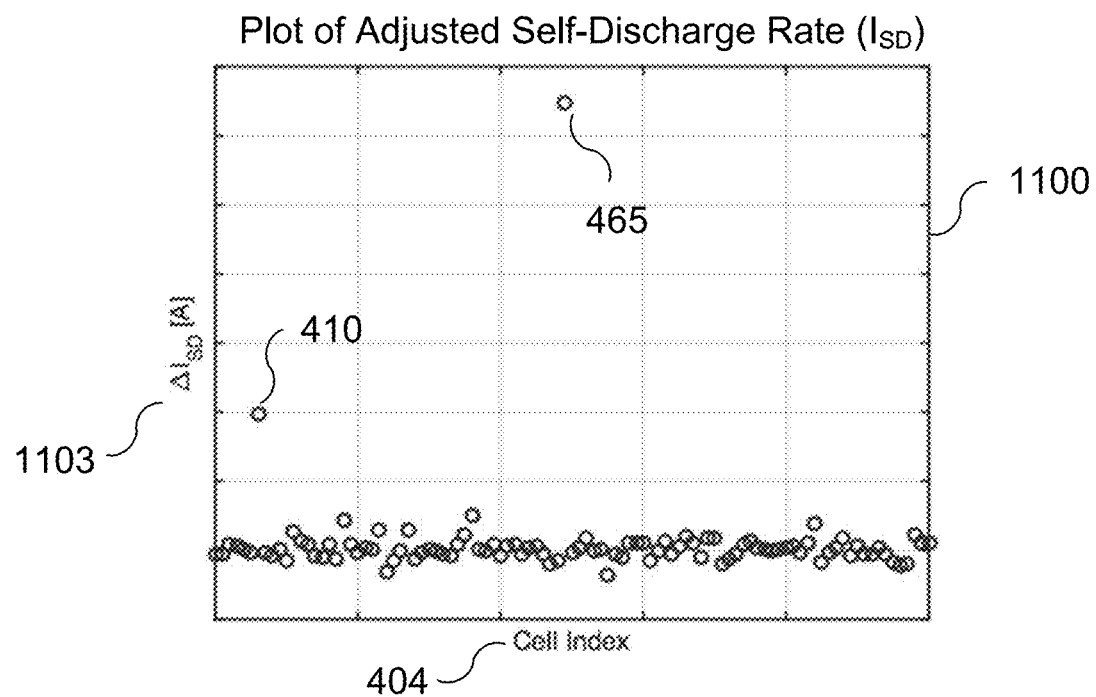
FIG. 11 shows a plot of the adjusted self-discharge rate estimated using an exemplary method as described herein.

FIG. 11 shows a plot of the adjusted self-discharge rate estimated using the method of FIG. 10 for cells in sub-modules of the battery system. The plot 1100 is a two-dimensional graph depicting the adjusted self-discharge rate for each individual cell (represented by a cell index) in the battery system with Cell Index 404 on the x-axis and adjusted self-discharge rate (denoted simply as $I_{SD}$) 1103 corresponding to each cell index on the y-axis. In the example shown, an adjusted self-discharge rate ($I_{SD}$) is determined by the method of FIG. 10.

Unlike the result shown in FIG. 9, in the example of FIG. 11 the two problematic cells—the cell at 410 and the cell at 465—are distinctly shown as outliers having higher adjusted self-discharge rates ($I_{SD}$) than the others. In particular, by adjusting the estimated self-discharge rate for cell 465 to compare its rate to its neighboring sub-module cells rather than to the general cell population in the battery system has set cell 465 apart from the other cells and identified it as a problematic self-discharging cell. In this case, a threshold can easily be chosen that minimizes false positives while flagging the problematic self-discharging cells at 410 and 465.

Note that the method of FIG. 10 for estimating an adjusted self-discharge rate that compares each cell in a sub-module to its neighboring sub-module cells rather than to the general cell population can also be applied to estimate any cell state value for each cell to provide a self-discharge indicator. This method can be applied to determine an adjusted cell voltage, an adjusted cell SOC value, or an adjusted capacity. Accordingly, a method applied to estimate an adjusted cell state value is described in the following figure.

Figure 12:
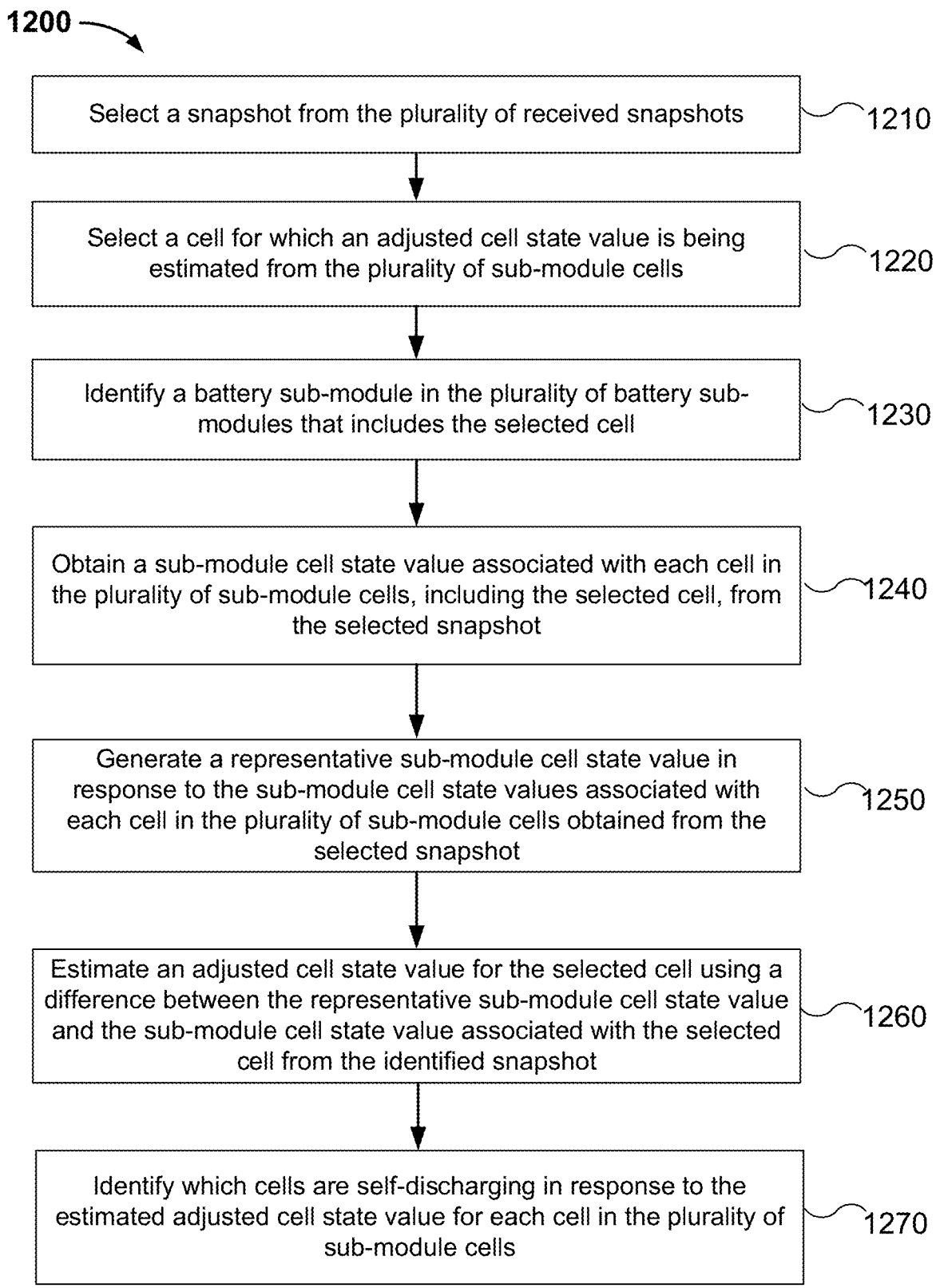
FIG. 12 is a flowchart of an exemplary method to estimate an adjusted cell state value.

FIG. 12 is a flowchart of an exemplary method to estimate an adjusted cell state value, including by taking into consideration of cell differences due to the particular group or collection of cells in a battery sub-module and thus accounting for variation between sub-modules. In some embodiments, the step 220 to estimate a self-discharge indicator using at least one snapshot in the plurality of snapshots includes various steps as depicted in FIG. 12 to estimate an adjusted cell state value for the cell that adjusts for the block to block variation between groups of cells that share a sub-module.

As shown in FIG. 12, a method to estimate a self-discharge indicator using at least one snapshot in a plurality of snapshots obtained by monitoring a battery system in a quiescent state at a plurality of times includes estimating an adjusted cell state value for each cell in the plurality of sub-module cells.

The method begins by selecting a snapshot from the plurality of received snapshots at 1210 and selecting a cell for which an adjusted cell state value is being estimated from the plurality of sub-module cells at 1220. The method also includes identifying a battery sub-module in the plurality of battery sub-modules that includes the selected cell at 1230. For example, in FIG. 1, if an adjusted cell state value was being determined for any of cells 121, then battery sub-module 111 would be identified at step 1230.

A sub-module cell state value associated with each cell in the plurality of sub-module cells, including the selected cell, is obtained from the selected snapshot at 1240. For example, the sub-module cell state value may be obtained from one of the two snapshots depicting cell voltages as shown in FIG. 4. Alternatively, the sub-module cell state value may be determined from the cell voltages obtained from a snapshot, by converting each of the cell voltages to an SOC value (e.g., using a characteristic voltage-SOC curve as shown in FIG. 5) for each sub-module cell, or by converting each of the sub-module SOC values to a capacity for each sub-module cell (e.g. as depicted in and described with respect to FIG. 7).

Returning to FIG. 12, a representative sub-module cell state value is generated at 1250 in response to the sub-module cell state values associated with each cell in the plurality of sub-module cells obtained from the selected snapshot. As an example, the representative sub-module cell state value can be a median or a mean value of the sub-module cell state values associated with each cell in the plurality of sub-module cells obtained from the selected snapshot but other methods of determining a representative sub-module cell state value may also be used.

An adjusted cell state value for the selected cell is estimated at 1260 using a difference between the representative sub-module cell state value and the sub-module cell state value associated with the selected cell from the identified snapshot.

Finally, the method of FIG. 12 includes identifying which cells are self-discharging in response to the estimated adjusted cell state value for each cell in the plurality of sub-module cells at 1270. A threshold can be used to determine whether an adjusted cell state value for a particular cell is unacceptably high and requires a remedy.

As described above, to better monitor self-discharge rates requires consideration of cell differences due to the arrangement of cells in replaceable units or battery sub-modules. In particular, as shown in the following figure, the technique can be applied to determine an adjusted state of charge value for each cell in a battery sub-module to account for varying SOC levels between cells of different sub-modules.

Figure 13:
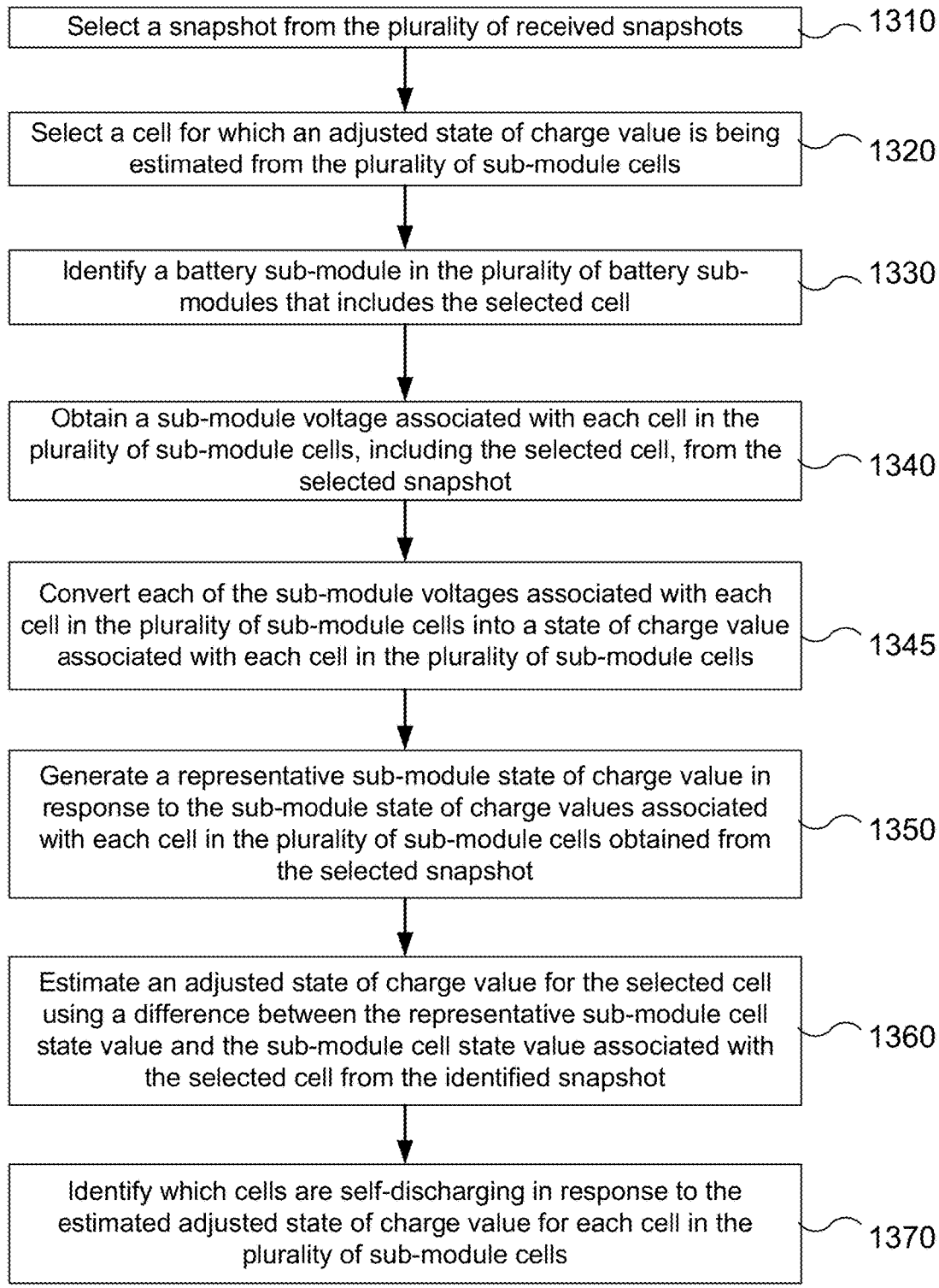
FIG. 13 is a flowchart of an exemplary method to estimate an adjusted state of charge value.

FIG. 13 is a flowchart of an exemplary method to estimate an adjusted state of charge value, including by taking into consideration of cell differences due to the particular group or collection of cells in a battery sub-module and thus accounting for variation between sub-modules. In some embodiments, the step 220 to estimate a self-discharge indicator using at least one snapshot in the plurality of snapshots includes various steps as depicted in FIG. 13 to estimate an adjusted state of charge value for the cell that adjusts for the block to block variation between groups of cells that share a sub-module. As depicted in FIG. 1, the battery system includes a plurality of battery sub-modules, each of the plurality of battery sub-modules includes a plurality of sub-module cells and each cell in the plurality of sub-module cells has a cell state value captured in each of the plurality of received snapshots. Additionally, each of the cell state values captured in each of the plurality of received snapshots for each cell in the plurality of sub-module cells is a voltage associated with each cell in the plurality of sub-module cells, as shown for example in FIG. 4.

Returning to FIG. 13, a method to estimate a self-discharge indicator using at least one snapshot in a plurality of snapshots obtained by monitoring a battery system in a quiescent state at a plurality of times includes estimating an adjusted state of charge value for each cell in the plurality of sub-module cells.

The method begins by selecting a snapshot from the plurality of received snapshots at 1310 and selecting a cell for which an adjusted state of charge value is being estimated from the plurality of sub-module cells at 1220. The method also includes identifying a battery sub-module in the plurality of battery sub-modules that includes the selected cell at 1330. For example, in FIG. 1, if an adjusted cell state value was being determined for any of cells 121, then battery sub-module 111 would be identified at step 1330.

A sub-module voltage associated with each cell in the plurality of sub-module cells, including the selected cell, is obtained from the selected snapshot at 1340. For example, the sub-module voltage may be obtained from one of the two snapshots depicting cell voltages as shown in FIG. 4.

At 1345, each of the sub-module voltages associated with each cell in the plurality of sub-module cells is converted into a state of charge value associated with each cell in the plurality of sub-module cells.

A representative sub-module state of charge value is generated at 1350 in response to the sub-module state of charge values associated with each cell in the plurality of sub-module cells obtained from the selected snapshot. As an example, the representative sub-module state of charge value can be a median or a mean value of the sub-module state of charge values associated with each cell in the plurality of sub-module cells obtained from the selected snapshot but other methods of determining a representative sub-module state of charge value may also be used.

An adjusted state of charge value for the selected cell is estimated at 1360 using a difference between the representative sub-module state of charge value and the sub-module state of charge value associated with the selected cell from the identified snapshot.

Finally, the method of FIG. 13 includes identifying which cells are self-discharging in response to the estimated adjusted state of charge value for each cell in the plurality of sub-module cells at 1370. The following figure shows a plot of the estimated adjusted state of charge values using voltages obtained from the two snapshots in FIG. 4.

Figure 14:
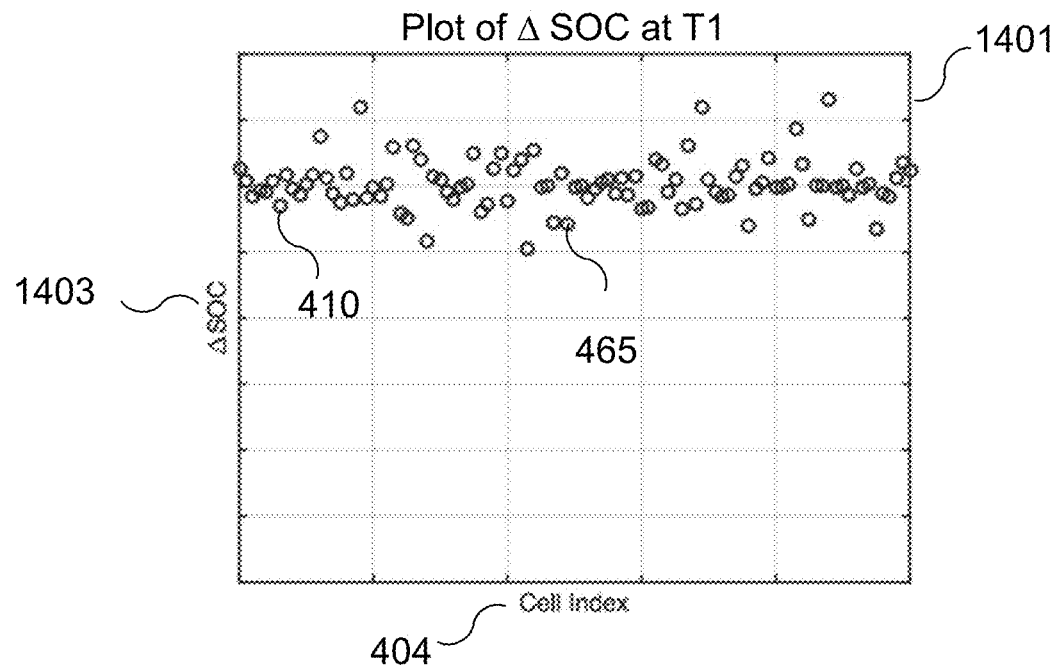
FIG. 14 depicts an example of two plots that show the estimated adjusted state of charge value for each cell in a plurality of sub-module cells obtained by an exemplary method as described herein.
Figure 14:
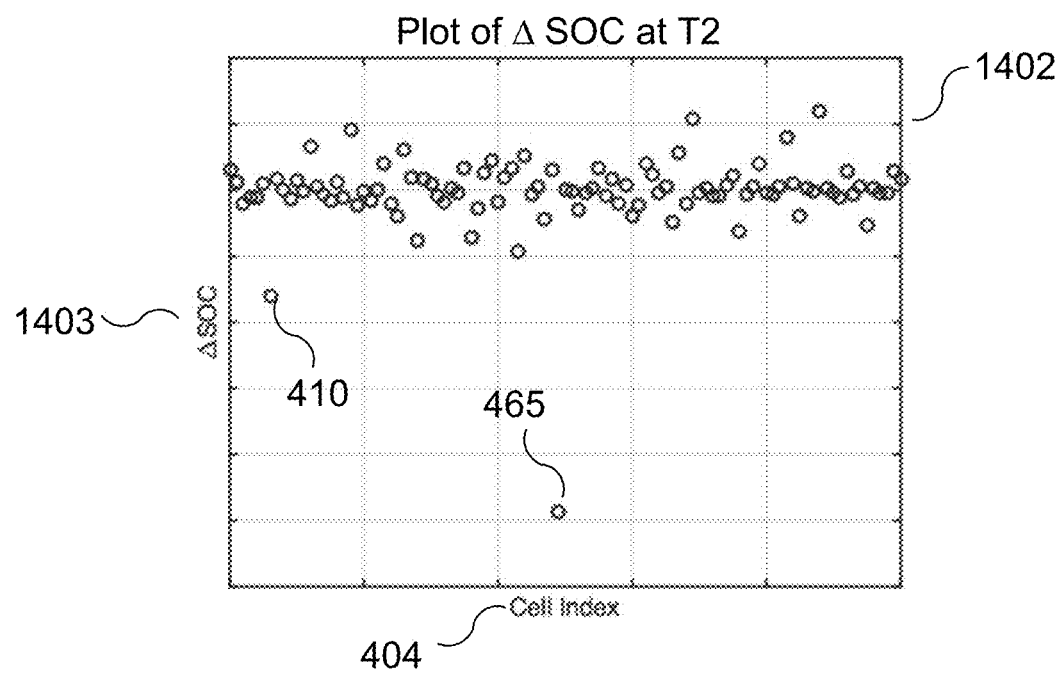

FIG. 14 depicts an example of two plots that show the estimated adjusted state of charge value (denoted as $\Delta SOC$) for each cell in the plurality of sub-module cells obtained by the method of FIG. 13. The plots are two-dimensional graphs depicting the $\Delta SOC$ for each individual cell (represented by a cell index) in the battery system at two different times T1 and T2, with Cell Index 404 on the x-axis and $\Delta SOC$ 1403 corresponding to each cell index on the y-axis. A comparison of the two plots in FIG. 14 indicates a similar outcome identifying the same two outlier cells—the cell at 410 and the cell at 465—as shown in FIG. 6, which plots the SOC values for each cell without adjusting for the sub-module effect. In the example shown in FIG. 14, the first plot 1401 shows $\Delta SOC$ values for the cells clustered at around the same value with no outliers indicating no problematic self-discharging cells, while the second plot 1402 shows that, after the passage of time between T1 and T2, the $\Delta SOC$ values appear to remain the same, with two cells—the cell at 410 and the cell at 465—having decreased more in $\Delta SOC$ than the others. In this particular example, comparing plot 602 of FIG. 6 to plot 1402 of FIG. 14, it seems that adjusting for the sub-module effect by comparing each SOC value for a cell to the SOC values of its neighboring cells within the same sub-module appears to produce at least some improvement in distinguishing the problematic cell at 410 from the others.

As described above, a threshold can be used to determine whether a self-discharge indicator, including for example, an adjusted state of charge value or an adjusted self-discharge rate for a particular cell is unacceptably high and requires a remedy. In particular, in response to the self-discharge indicator exceeding the threshold, a remedy is recommended for the battery system.

A threshold can be determined based on an ability or inability to mitigate or compensate for the loss due to self-discharge by cell balancing and charging. For example, replacing a battery sub-module may be inconvenient and/or time-consuming, so replacement may not occur until absolutely necessary. The threshold can also be based at least in part on a remaining amount of time in the quiescent state or on balancing settings or parameters (e.g., balancing rate and/or balancing duty cycle).

In the case of an aircraft battery system, an aircraft can have an ability to replace lost charge and to correct the imbalance due to self-discharge at a balancing rate, for example, of roughly 0.01/hour if balancing and charging are performed for about one hour per day. Accordingly, the balancing rate of 0.01/day (assuming a balancing rate of 0.01/hour and a duty cycle of one hour of balancing and charging per day) can be used to establish a threshold for the self-discharge rates estimated for each cell. That is, no remedy or intervention would be recommended for cells having self-discharge rates falling below the threshold of 0.01/day but cells exceeding the threshold would require additional charging and/or balancing beyond the aircraft's normal operation. Note that this threshold value may change depending on the remaining amount in the quiescent state, which impacts the total amount of self-discharge, and on the balancing rate and the duty cycle, which impacts how much loss due to self-discharge can be mitigated over a given amount of time. A higher self-discharge rate can still be mitigated or compensated for if the balancing rate is raised accordingly (i.e. increase the balancing rate) or if balancing is performed on a more frequent basis (i.e. increase the duty cycle).

In addition, there may be a second threshold above which no amount of balancing and charging can remedy the self-discharge rate of a particular problematic cell. In this case, the self-discharge rate of the problematic cell exceeds the ability to replace the lost charge by cell balancing and charging, and the recommended remedy would be to replace the battery sub-module which includes the problematic cell.

Figure 15:
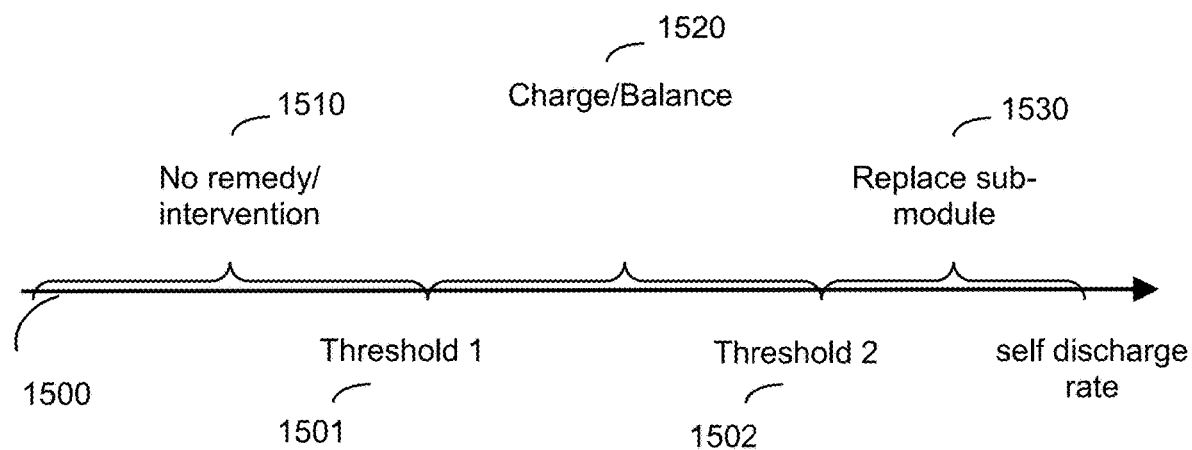
FIG. 15 illustrates the use of thresholds to determine remedy recommendations in an exemplary embodiment as described herein.

FIG. 15 illustrates the use of thresholds to determine remedy recommendations in an exemplary embodiment as described herein. In some embodiments, the remedy includes charging a selected cell for which an adjusted self-discharge rate, an adjusted state of charge value, or an adjusted cell state value is being estimated (e.g., a selected cell that has a low amount of charge), including by discharging another cell in the same battery sub-module as the selected cell (e.g., another cell that has a higher amount of charge and can be damaged if overcharged while attempting to charge the low charge cell for which the self-discharge rate is being estimated). The remedy can also include replacing a battery sub-module which includes the selected cell.

FIG. 15 shows different thresholds that can be established to set ranges for self-discharge levels. In some embodiments, steps 230 and 240 in FIG. 2 use the exemplary technique shown here. These ranges determine whether no remedy or intervention is warranted, whether the self-discharge rate of a problematic self-discharging cell can be remedied by balancing or charging the cell, or whether the battery sub-module having the problematic self-discharging cell should be replaced. The self-discharge rate is shown on a one-dimensional plot as increasing from left to right on a horizontal axis 1500. In the range between zero and Threshold 1 at 1501, the recommendation may be for no remedy or intervention 1510 provided the self-discharge rate does not exceed Threshold 1 at 1501. In the range including Threshold 1 at 1501 and up to Threshold 2 at 1502, that is if the self-discharge rate is equal to or exceeds Threshold 1 but is less than Threshold 2, the recommended remedy may include balancing and charging the self-discharging cell. Finally, in the range where the self-discharge rate is equal to or exceeds Threshold 2 at 1502, the recommended remedy may be to replace the sub-module that includes the self-discharging cell. The thresholds in FIG. 15 illustrate just one example—various other methods of establishing thresholds and ranges may be employed that fall within the scope of the technique described herein.

Figure 16:
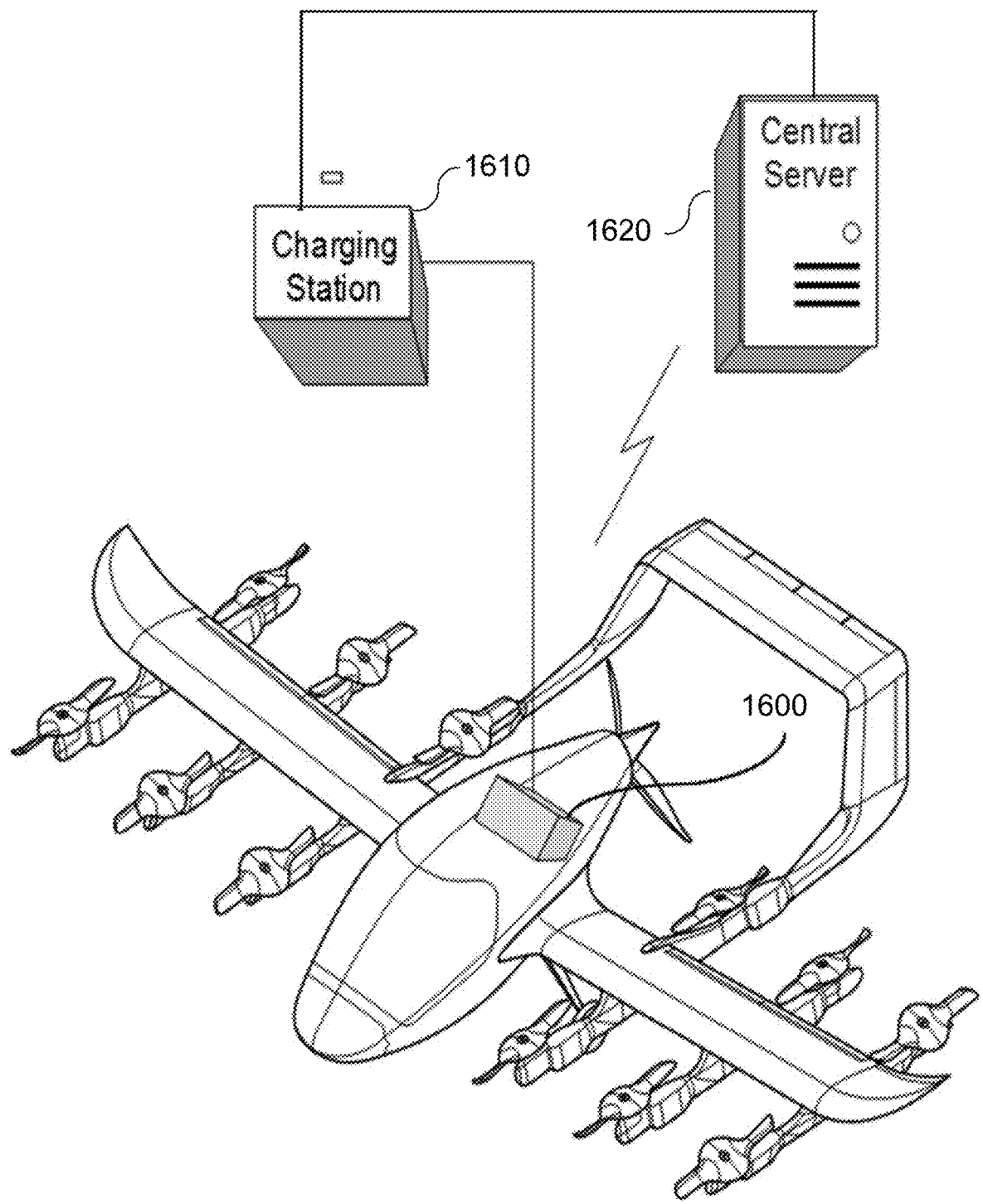
FIG. 16 illustrates an embodiment of a system for estimating a self-discharge rate for use as a measure of battery health that includes a central server and a charging station.

FIG. 16 illustrates an embodiment of a system for estimating a self-discharge rate for use as a measure of battery health that includes a central server and a charging station. In this example, the plurality of snapshots are received by a central server 1620 via a charging station 1610, which is electrically coupled to a battery system 1600. In this example, the central server 1620 estimates a self-discharge rate and compares the self-discharge rate against a threshold as described above. Referring back to FIG. 1, the charging station may communicate with the BMS in each battery sub-module and obtain raw data captured for each battery sub-module and upload it to the central server for analysis and/or processing. In some embodiments, the information which is passed from the BMS modules to the central server via a charging station includes snapshots of voltages, as shown in FIG. 4.

In other embodiments, the battery system 1600 (or, more specifically, the BMS modules) estimates a self-discharge rate and compares the self-discharge rate against a threshold as described above. In this case, the battery system 1600 sends a result of the comparison of the self-discharge rate to a central server 1620 via a charging station 1610, which is electrically coupled to the battery system.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system comprising a server configured to:
  receive a plurality of snapshots, wherein:
    the plurality of snapshots are obtained by monitoring a battery system in a quiescent state at a plurality of times,
    each snapshot includes a plurality of cell state values for a plurality of cells within a respective sub-module of the battery system at one of the plurality of times, and
    each of the plurality of cell state values is a voltage associated with each cell in the plurality of cells;
  convert each of the voltages associated with each cell in the plurality of cells into a state of charge value associated with each cell in the plurality of cells;

convert the state of charge value associated with each cell in the plurality of cells into a capacity associated with each cell in the plurality of cells;
estimate a self-discharge indicator using the plurality of snapshots including estimate a self-discharge rate by taking a time derivative of the capacity associated with each cell in the plurality of cells over at least two of the plurality of snapshots wherein each of the at least two of the plurality of snapshots includes a plurality of cell state values at two different times;
compare the self-discharge indicator to a threshold; and
instruct a cell of the battery system to charge or balance in response to the self-discharge indicator exceeding the threshold.

2. The system recited in claim 1, wherein:
the battery system includes a plurality of battery sub-modules;
each battery sub-module in the plurality of battery sub-modules includes a plurality of cells; and
the self-discharge indicator is associated with a cell.

3. The system recited in claim 1, wherein the battery system in the quiescent state excludes cell balancing and charging.

4. The system recited in claim 1, wherein the self-discharge indicator is a voltage, a state of charge, a capacity, or a self-discharge rate.

5. The system recited in claim 1, wherein:
the battery system includes a plurality of battery sub-modules;
each of the plurality of battery sub-modules includes a plurality of sub-module cells; and
each cell in the plurality of sub-module cells has a cell state value captured in each of the plurality of received snapshots; and
the server is further configured to:
    estimate an adjusted self-discharge rate for each cell in the plurality of sub-module cells, including:
        selecting a snapshot from the plurality of received snapshots;
        selecting a cell for which an adjusted self-discharge rate is being estimated from the plurality of sub-module cells;
        identifying a battery sub-module in the plurality of battery sub-modules that includes the selected cell;
        obtaining a sub-module self-discharge rate associated with each cell in the plurality of sub-module cells, including the selected cell, from the selected snapshot;
        generating a representative sub-module self-discharge rate in response to sub-module cell state values associated with each cell in the plurality of sub-module cells obtained from the selected snapshot; and
        estimating an adjusted self-discharge rate for the selected cell using a difference between the representative sub-module self-discharge rate and the sub-module self-discharge rate associated with the selected cell from the selected snapshot; and
    identify which cells are self-discharging in response to the estimated adjusted self-discharge rate for each cell in the plurality of sub-module cells.

6. The system recited in claim 5, wherein generating a representative sub-module self-discharge rate comprises determining a median value of the self-discharge rate associated with each cell in the plurality of sub-module cells obtained from the selected snapshot.

7. The system recited in claim 1, wherein:
the battery system includes a plurality of battery sub-modules;
each of the plurality of battery sub-modules includes a plurality of sub-module cells; and
each cell in the plurality of sub-module cells has a cell state value captured in each of the plurality of received snapshots; and
the server is further configured to:
    estimate an adjusted cell state value for each cell in the plurality of sub-module cells including:
        selecting a snapshot from the plurality of received snapshots;
        selecting a cell for which an adjusted cell state value is being estimated from the plurality of sub-module cells;
        identifying a battery sub-module in the plurality of battery sub-modules that includes the selected cell;
        obtaining a sub-module cell state value associated with each cell in the plurality of sub-module cells, including the selected cell, from the selected snapshot;
        generating a representative sub-module cell state value in response to the sub-module cell state values associated with each cell in the plurality of sub-module cells obtained from the selected snapshot; and
        estimating an adjusted cell state value for the selected cell using a difference between the representative sub-module cell state value and the sub-module cell state value associated with the selected cell from the selected snapshot; and
    identify which cells are self-discharging in response to the estimated adjusted cell state value for each cell in the plurality of sub-module cells.

8. The system recited in claim 7, wherein generating a representative sub-module cell state value comprises determining a median value of the sub-module cell state values associated with each cell in the plurality of sub-module cells obtained from the selected snapshot.

9. The system recited in claim 1, wherein:
the battery system includes a plurality of battery sub-modules; and
each of the plurality of battery sub-modules includes a plurality of sub-module cells; and
each cell in the plurality of sub-module cells has a cell state value captured in each of the plurality of received snapshots;
each of the cell state values captured in each of the plurality of received snapshots for each cell in the plurality of sub-module cells is a voltage associated with each cell in the plurality of sub-module cells, and
the server is further configured to:
    estimate an adjusted cell state value for each cell in the plurality of sub-module cells including:
        selecting a snapshot from the plurality of received snapshots;
        selecting a cell for which an adjusted state of charge value is being estimated from the plurality of sub-module cells;
        identifying a battery sub-module in the plurality of battery sub-modules that includes the selected cell;
        obtaining a sub-module voltage associated with each cell in the plurality of sub-module cells, including the selected cell, from the selected snapshot;

converting each of the sub-module voltages associated with each cell in the plurality of sub-module cells into a state of charge value associated with each cell in the plurality of sub-module cells;
generating a representative sub-module state of charge value in response to sub-module state of charge values associated with each cell in the plurality of sub-module cells obtained from the selected snapshot; and
estimating an adjusted state of charge value for the selected cell using a difference between the representative sub-module state of charge value and the sub-module state of charge value associated with the selected cell from the selected snapshot; and
identify which cells are self-discharging in response to the estimated adjusted state of charge value for each cell in the plurality of sub-module cells.

10. The system recited in claim 9, wherein generating a representative sub-module state of charge value comprises determining a median value of the sub-module state of charge values associated with each cell in the plurality of sub-module cells obtained from the selected snapshot.

11. The system recited in claim 1, wherein:
the battery system includes a plurality of battery sub-modules;
each battery sub-module in the plurality of battery sub-modules includes a plurality of cells;
the self-discharge indicator is associated with a cell; and
the server is further configured to instruct another cell in the same battery sub-module as the cell for which the self-discharge indicator is being estimated to discharge in response to the self-discharge indicator exceeding the threshold.

12. The system recited in claim 1, wherein:
the battery system includes a plurality of battery sub-modules;
each battery sub-module in the plurality of battery sub-modules includes a plurality of cells;
the self-discharge indicator is associated with a cell;
the server is further configured to instruct another cell in the same battery sub-module as the cell for which the self-discharge indicator is being estimated to discharge in response to the self-discharge indicator exceeding the threshold; and
the threshold is based at least in part on capacity to replace lost charge as indicated by a remaining amount of time in the quiescent state.

13. The system recited in claim 1, wherein:
the battery system includes a plurality of battery sub-modules;
each battery sub-module in the plurality of battery sub-modules includes a plurality of cells;
the self-discharge indicator is associated with a cell; and
the server is further configured to instruct another cell in the same battery sub-module as the cell for which the self-discharge indicator is being estimated to be replaced in response to the self-discharge indicator exceeding the threshold.

14. The system recited in claim 1, wherein:
the battery system includes a plurality of battery sub-modules;
each battery sub-module in the plurality of battery sub-modules includes a plurality of cells;
the self-discharge indicator is associated with a cell;
the server is further configured to instruct another cell in the same battery sub-module as the cell for which the self-discharge indicator is being estimated to be replaced in response to the self-discharge indicator exceeding the threshold; and
the threshold is based at least in part on capacity to replace lost charge as indicated by a balancing rate and a balancing duty cycle.

15. The system recited in claim 1, wherein:
the plurality of snapshots are received by the server via a charging station which is electrically coupled to the battery system; and
the server estimates the self-discharge indicator and compares the self-discharge indicator against the threshold.

16. The system recited in claim 1, wherein:
the battery system estimates the self-discharge indicator and compares the self-discharge indicator against the threshold; and
the battery system sends a result of comparison of the self-discharge indicator to the server via a charging station which is electrically coupled to the battery system.

17. A method comprising:
receiving a plurality of snapshots, wherein:
the plurality of snapshots are obtained by monitoring a battery system in a quiescent state at a plurality of times,
each snapshot includes a plurality of cell state values for a plurality of cells within a respective sub-module of the battery system at one of the plurality of times, and
each of the plurality of cell state values is a voltage associated with each cell in the plurality of cells;
converting each of the voltages associated with each cell in the plurality of cells into a state of charge value associated with each cell in the plurality of cells;
converting the state of charge value associated with each cell in the plurality of cells into a capacity associated with each cell in the plurality of cells;
estimating a self-discharge indicator using at least one snapshot in the plurality of snapshots including estimating a self-discharge rate by taking a time derivative of the capacity associated with each cell in the plurality of cells over at least two of the plurality of snapshots wherein each of the at least two of the plurality of snapshots includes a plurality of cell state values at two different times;
comparing the self-discharge indicator to a threshold; and
recommending a remedy for the battery system by charging or balancing a cell of the battery system in response to the self-discharge indicator exceeding the threshold.

18. A computer program product for estimating a self-discharge discharge indicator for battery health, the computer program product being embodied in a non-transitory computer readable storage medium in a server and comprising computer instructions for:
receiving a plurality of snapshots, wherein:
the plurality of snapshots are obtained by monitoring a battery system in a quiescent state at a plurality of times,
each snapshot includes a plurality of cell state values for cells within a respective sub-module of the battery system at one of the plurality of times
each of the plurality of cell state values is a voltage associated with each cell in the plurality of cells;
converting each of the voltages associated with each cell in the plurality of cells into a state of charge value associated with each cell in the plurality of cells;

converting the state of charge value associated with each cell in the plurality of cells into a capacity associated with each cell in the plurality of cells;

estimating a self-discharge indicator using at least one snapshot in the plurality of snapshots including estimating a self-discharge rate by taking a time derivative of the capacity associated with each cell in the plurality of cells over at least two of the plurality of snapshots wherein each of the at least two of the plurality of snapshots includes a plurality of cell state values at two different times;

comparing the self-discharge indicator to a threshold; and recommending a remedy for the battery system by charging or balancing a cell of the battery system in response to the self-discharge indicator exceeding the threshold.

* * * * *